(12) United States Patent
Nakagawa

(10) Patent No.: US 7,358,532 B2
(45) Date of Patent: Apr. 15, 2008

(54) ELECTRO-OPTICAL DEVICE AND ELECTRONIC APPARATUS

(75) Inventor: Masashi Nakagawa, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 105 days.

(21) Appl. No.: 11/482,380

(22) Filed: Jul. 7, 2006

(65) Prior Publication Data

US 2007/0029644 A1    Feb. 8, 2007

(30) Foreign Application Priority Data

Aug. 3, 2005    (JP) ............................. 2005-225070

(51) Int. Cl.
*H01L 31/20*    (2006.01)

(52) U.S. Cl. ................... 257/59; 257/E27.132; 257/72; 257/659; 257/660; 257/E27.133

(58) Field of Classification Search .................. 257/59, 257/E27.132
See application file for complete search history.

(56) References Cited

U.S. PATENT DOCUMENTS 5,811,846 A *  9/1998  Miura et al. ................. 257/291

FOREIGN PATENT DOCUMENTS

JP    A-2005-77484    3/2005

* cited by examiner

*Primary Examiner*—Tu-Tu Ho
(74) *Attorney, Agent, or Firm*—AdvantEdge Law Group, LLC

(57) ABSTRACT

An electro-optical device includes first switching elements which are correspondingly provided at intersections of a plurality of scanning lines and a plurality of data lines in a display region, at least three metal layers which are provided in the display region, a wiring line portion which is provided in an adjacent region of the display region and supplies signals to second switching elements through signal lines formed of at least two metal layers of the three metal layers, and an electromagnetic shield which is provided in the adjacent region of the display region. The electromagnetic shield has a first shield portion which covers the wiring line portion using metal layers other than the metal layers forming the signal lines, and a second shield portion which is electrically connected to the first shield portion and is disposed between the signal lines.

7 Claims, 14 Drawing Sheets

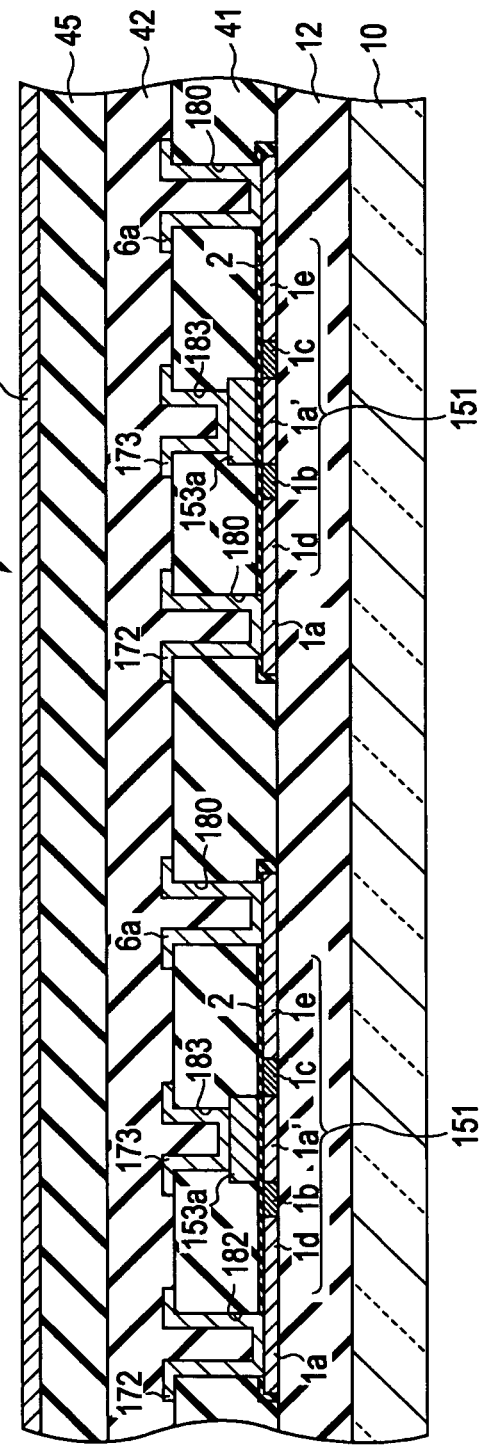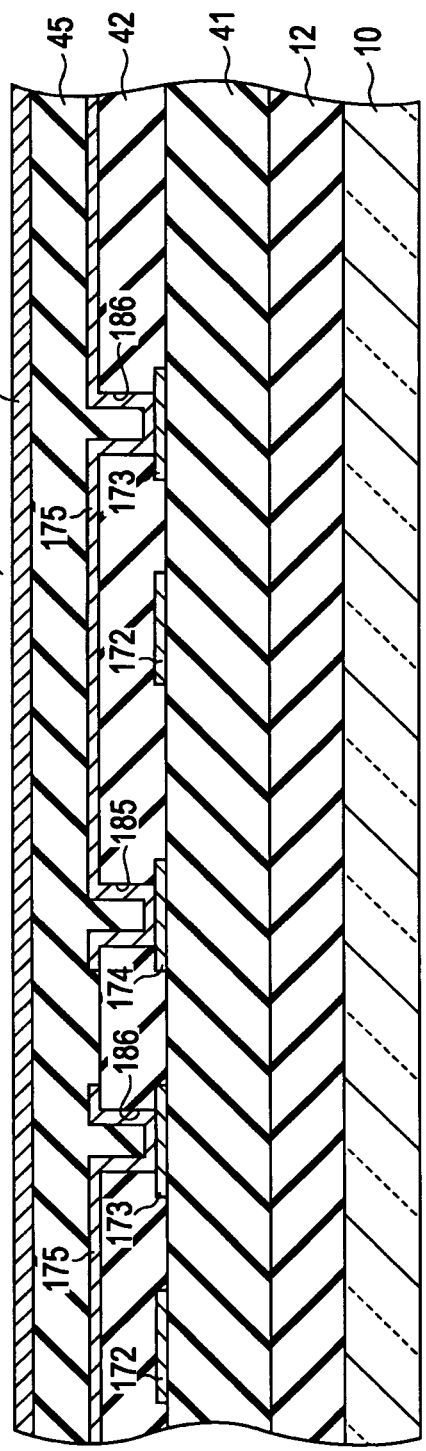

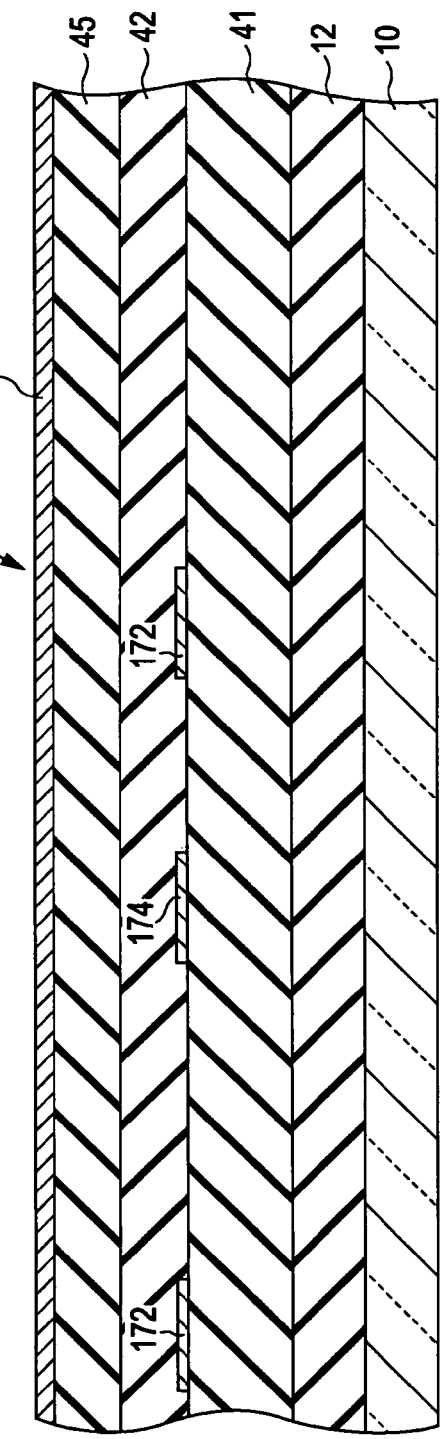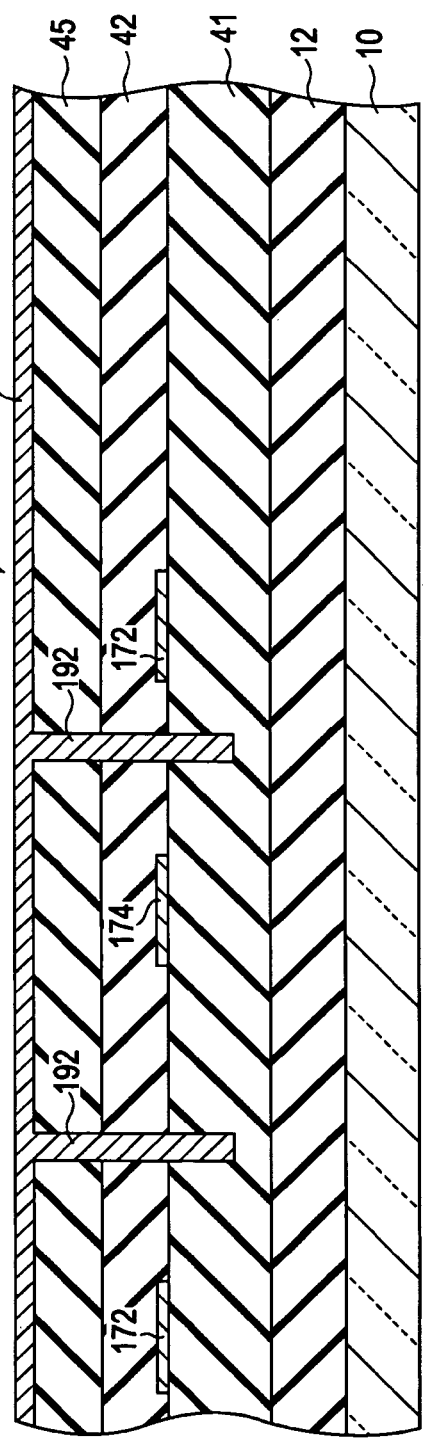

ELECTRO-OPTICAL DEVICE AND ELECTRONIC APPARATUS

BACKGROUND

1. Technical Field

The present invention relates to an electro-optical device which is suitable for high-definition image display, and to an electronic apparatus.

2. Related Art

For example, electro-optical devices such as liquid crystal devices have a driving circuit having a data line driving circuit for driving data lines, a scanning line driving circuit for driving scanning lines, and a sampling circuit for sampling image signals. The driving circuit is provided onto a substrate constituting a display unit. In such a driving circuit, at a timing of a sampling circuit driving signal to be supplied from the data line driving circuit, the sampling circuit samples image signals to be supplied onto image signals and supplies the sampled image signals to the data lines.

In an electro-optical device, in order to suppress an increase of a driving frequency and achieve high-definition image display, serial image signals are converted into a plurality of parallel image signals (that is, phase expansion), and the plurality of parallel image signals are supplied to a display unit through a plurality of image signal lines. This technique has been already implemented. In this case, the plurality of image signals are simultaneously sampled by a plurality of sampling switches, and are simultaneously supplied to a plurality of data lines.

In order to reduce noise due to an influence of adjacent signal lines to be formed at small pitches, for example, in JP-A-2005-77484, a technique has been disclosed in which electromagnetic shields are formed at essential places of a driving circuit (a gap between adjacent thin film transistors on a sampling circuit and so on).

However, in such an electro-optical device, with enhancement of high-definition image display and high-frequency image signals, like the technique disclosed in JP-A-2005-77484, even though the electromagnetic shields are formed at the essential places of the driving circuit, a large amount of leakage or flow of electromagnetic waves may occur from the electromagnetic shields, and adjacent signal lines may be capacitively coupled to each other.

SUMMARY

An advantage of some aspects of the invention is that it provides an electro-optical device which can suppress an influence by noise on image signals and perform high-quality image display, and an electronic apparatus.

According to a first aspect of the invention, an electro-optical device includes first switching elements which are correspondingly provided at intersections of a plurality of scanning lines and a plurality of data lines in a display region, at least three metal layers which are provided in the display region, a wiring line portion which is provided in an adjacent region of the display region and supplies signals to second switching elements through signal lines formed of at least two metal layers of the three metal layers, and an electromagnetic shield which is provided in the adjacent region of the display region. The electromagnetic shield has a first shield portion which covers the wiring line portion using metal layers other than the metal layers forming the signal lines, and a second shield portion which is electrically connected to the first shield portion and is disposed between the signal lines.

According to this configuration, since the wiring line portion is covered with the first shield portion, and each of the signal lines in the wiring line portion can be capacitively coupled to the first shield portion, a capacitively coupled component between adjacent signal lines is dispersed. Therefore, an influence by a change in potential of adjacent signal lines is reduced. Further, since the second shield portion is disposed at essential places in the wiring line portion, a high shield effect is achieved.

As a result, an influence by noise on image signals can be suppressed, and thus high-quality image display can be performed. In this case, since at least three metal layers form the display region and the signal lines are formed of at least two metal layers, wiring can be easily achieved. Further, the electromagnetic shield is formed using the metal layers other than the metal layers forming the signal lines, and thus the electromagnetic shield can be formed at arbitrary places of the adjacent region.

According to a second aspect of the invention, an electro-optical device includes first switching elements which are correspondingly provided at intersections of a plurality of scanning lines and a plurality of data lines in a display region, three metal layers which correspond to capacitor electrodes on both sides of each of storage capacitors to be formed in the display region and each of the plurality of data lines, a wiring line portion which is provided in an adjacent region of the display region and supplies signals to second switching elements through signal lines formed of at least two metal layers of the three metal layers, and an electromagnetic shield which is provided in the adjacent region of the display region. The electromagnetic shield has a first shield portion which covers the wiring line portion using a metal layer other than the metal layers forming the signal lines, and a second shield portion which is electrically connected to the first shield portion and is disposed between the signal lines.

According to this configuration, since the wiring line portion is covered with the first shield portion, and each of the signal lines in the wiring line portion can be capacitively coupled to the first shield portion, a capacitively coupled component between adjacent signal lines is dispersed. Therefore, an influence by a change in potential of adjacent signal lines is reduced. Further, since the second shield portion is disposed at essential places in the wiring line portion, a high shield effect is achieved.

As a result, an influence by noise on image signals can be suppressed, and thus high-quality image display can be performed. In this case, since the metal layer is formed to have three layers corresponding to the individual capacitor electrodes on both sides of each of the storage capacitors to be formed in the display region and each of the plurality of data lines, and the signal lines are formed in the adjacent region using the two metal layers of the three metal layers, wiring can be easily achieved. Further, the electromagnetic shield is formed using the remaining layers other than the layers forming the signal lines, and thus the electromagnetic shield can be formed at arbitrary places of the adjacent region.

In particular, it is preferable that the electromagnetic shield be formed to extend to a peripheral region of a display unit which covers a driving circuit of the second switching elements.

According to this configuration, the electromagnetic shield can extend to the driving circuit of the switching elements. Further, an influence by noise on image signals can be suppressed at higher level, and thus high-quality image display can be achieved.

It is preferable that the driving circuit drive the second switching elements in a display unit by phase expansion for every predetermined block, and the second shield portion be at least disposed between adjacent blocks.

According to this configuration, an increase of a driving frequency can be suppressed, and high-definition image display can be achieved. In particular, adjacent phases requiring a high shield effect can be reliably shielded from each other.

It is preferable that storage capacitors be provided in the display region, and the electromagnetic shield be formed of the same metal layer as one electrode forming each of the storage capacitors.

According to this configuration, the display region formed of three or more metal layers can be easily achieved, and the electromagnetic shield can be easily formed.

It is preferable that the electromagnetic shield be electrically connected to a fixed-potential-side electrode of each of the storage capacitors.

According to this configuration, the electromagnetic shield can maintain a constant potential, and an influence by a change in potential of signal lines can be effectively reduced by the first shield portion.

According to a third aspect of the invention, an electronic apparatus uses the electro-optical device (including the above-described aspects) as a display unit.

According to the third aspect of the invention, since the electronic apparatus includes the above-described electro-optical device, various electronic apparatus, which can perform high-quality image display, such as a projection display device, a mobile personal computer, a cellular phone, a liquid crystal television, a viewfinder-type or monitor-direct-view-type video tape recorder, a car navigation device, a pager, an electronic organizer, an electronic calculator, a word processor, a workstation, a video phone, a POS terminal, and an apparatus having a touch panel, can be achieved.

BRIEF DESCRIPTION OF THE DRAWINGS

The invention will be described with reference to the accompanying drawings, wherein like numbers reference like elements.

FIGS. 4 and 5 are superimposed.

FIGS. 4 and 5 are superimposed.

FIG. 10 is a cross-sectional view taken along the line X-X of FIG. 9.

FIG. 11 is a cross-sectional view taken along the line XI-XI of FIG. 9.

FIG. 12 is a cross-sectional view taken along the line XII-XII of FIG. 9.

FIG. 13 is a cross-sectional view taken along the line XIII-XIII of FIG. 9.

DESCRIPTION OF EXEMPLARY EMBODIMENTS

Figure 1:
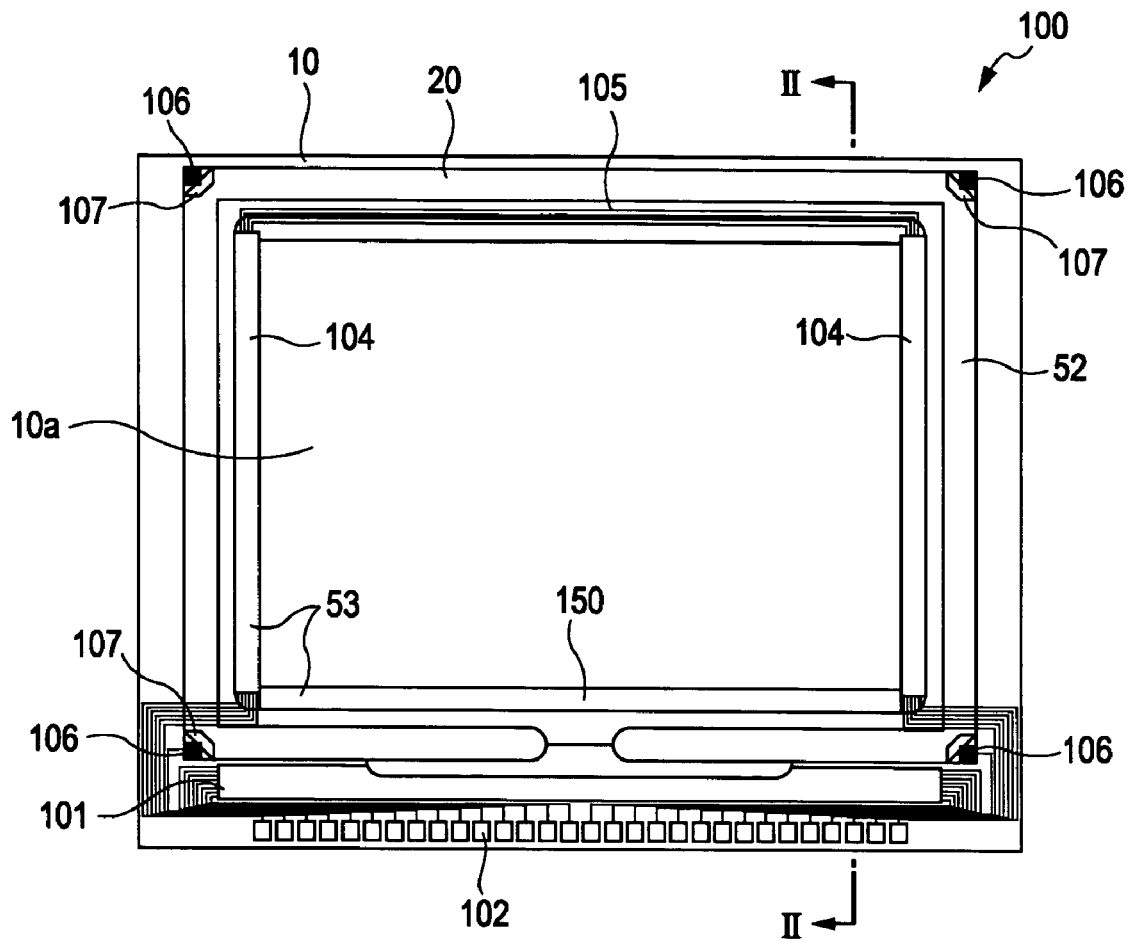
FIG. 1 is a plan view showing the configuration of a liquid crystal panel.
Figure 2:
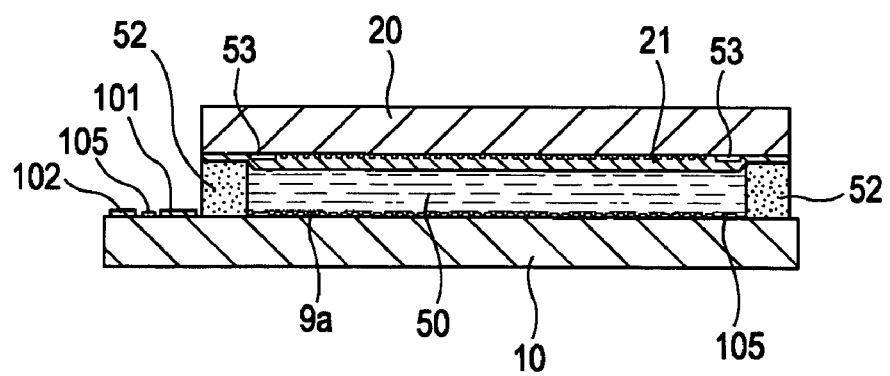
FIG. 2 is a cross-sectional view taken along the line II-II of FIG. 1.
Figure 3:
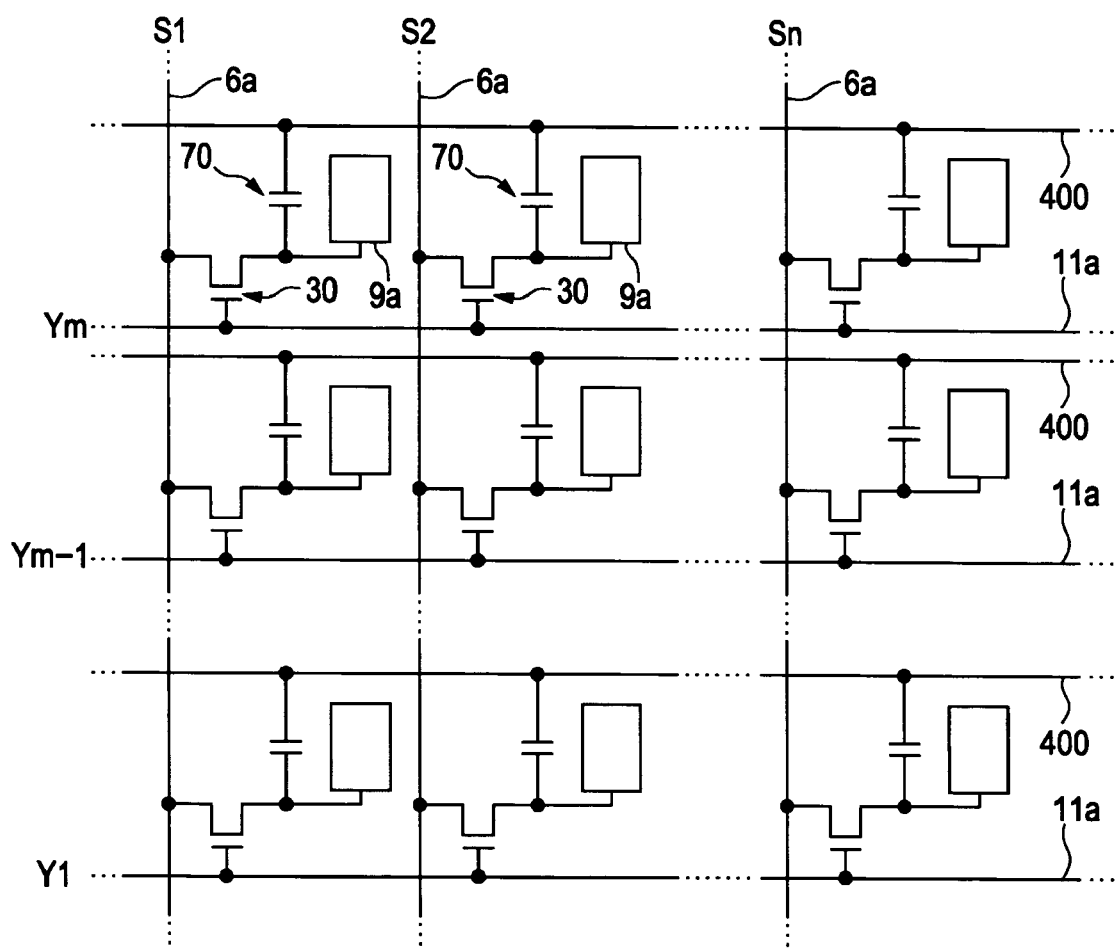
FIG. 3 is an equivalent circuit diagram of various elements, wiring lines, and so on in a plurality of pixels which are formed in a matrix shape so as to form an image display region of a liquid crystal panel.
Figure 4:
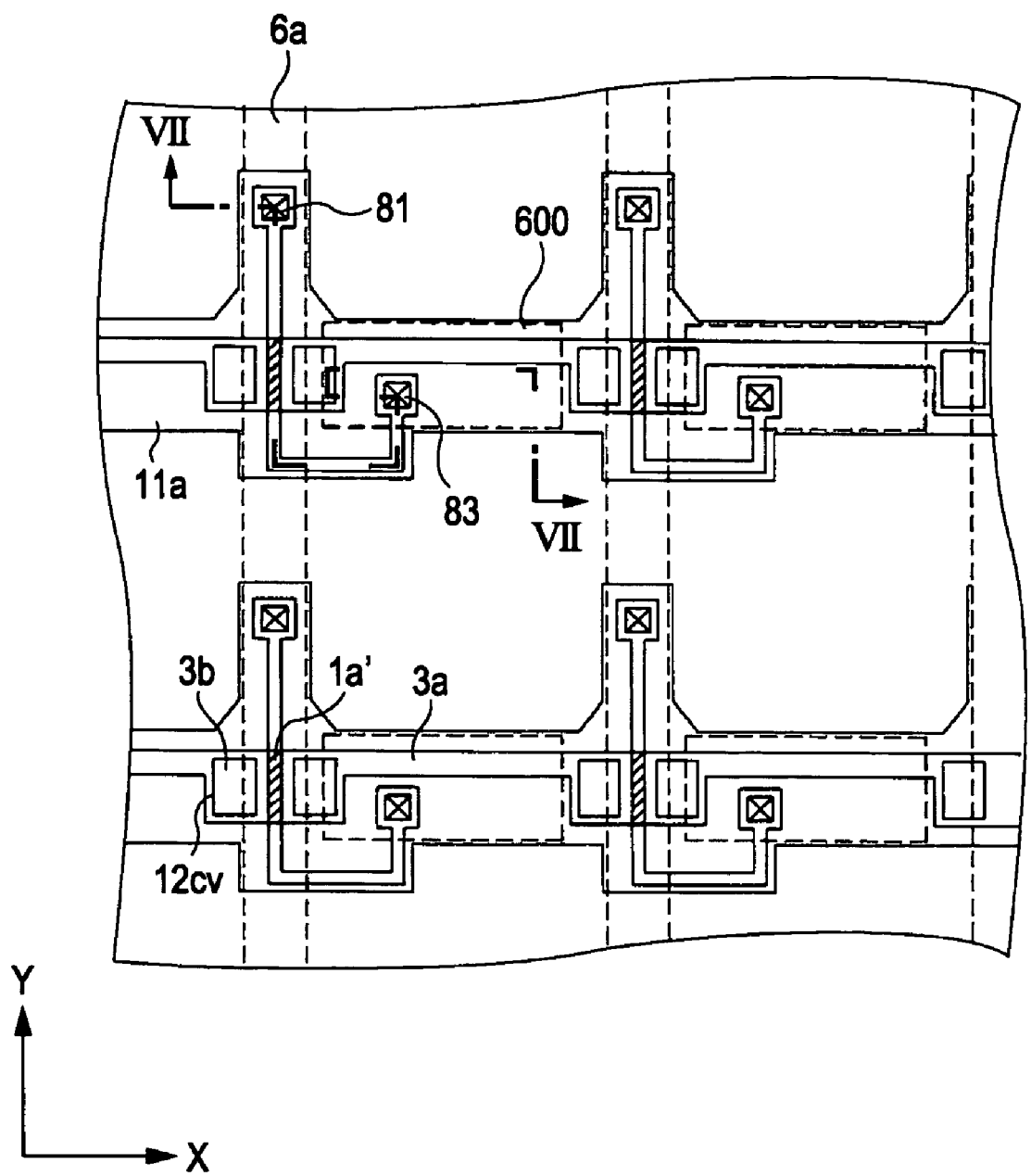
FIG. 4 is a plan view showing only the configuration of a lower layer portion in a group of pixels on a TFT array substrate.
Figure 5:
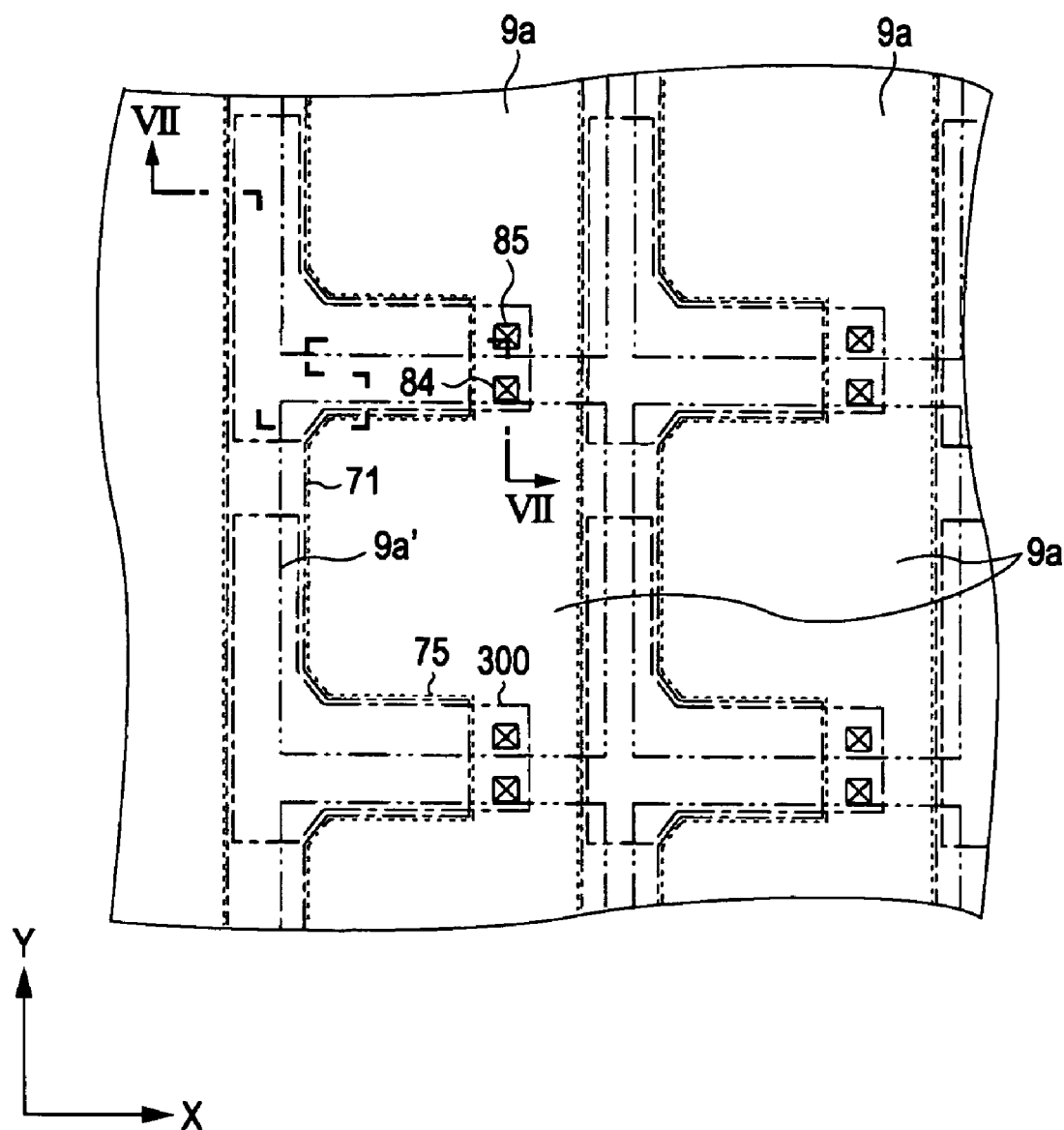
FIG. 5 is a plan view showing only the configuration of an upper layer portion in a group of pixels on a TFT array substrate.
Figure 6:
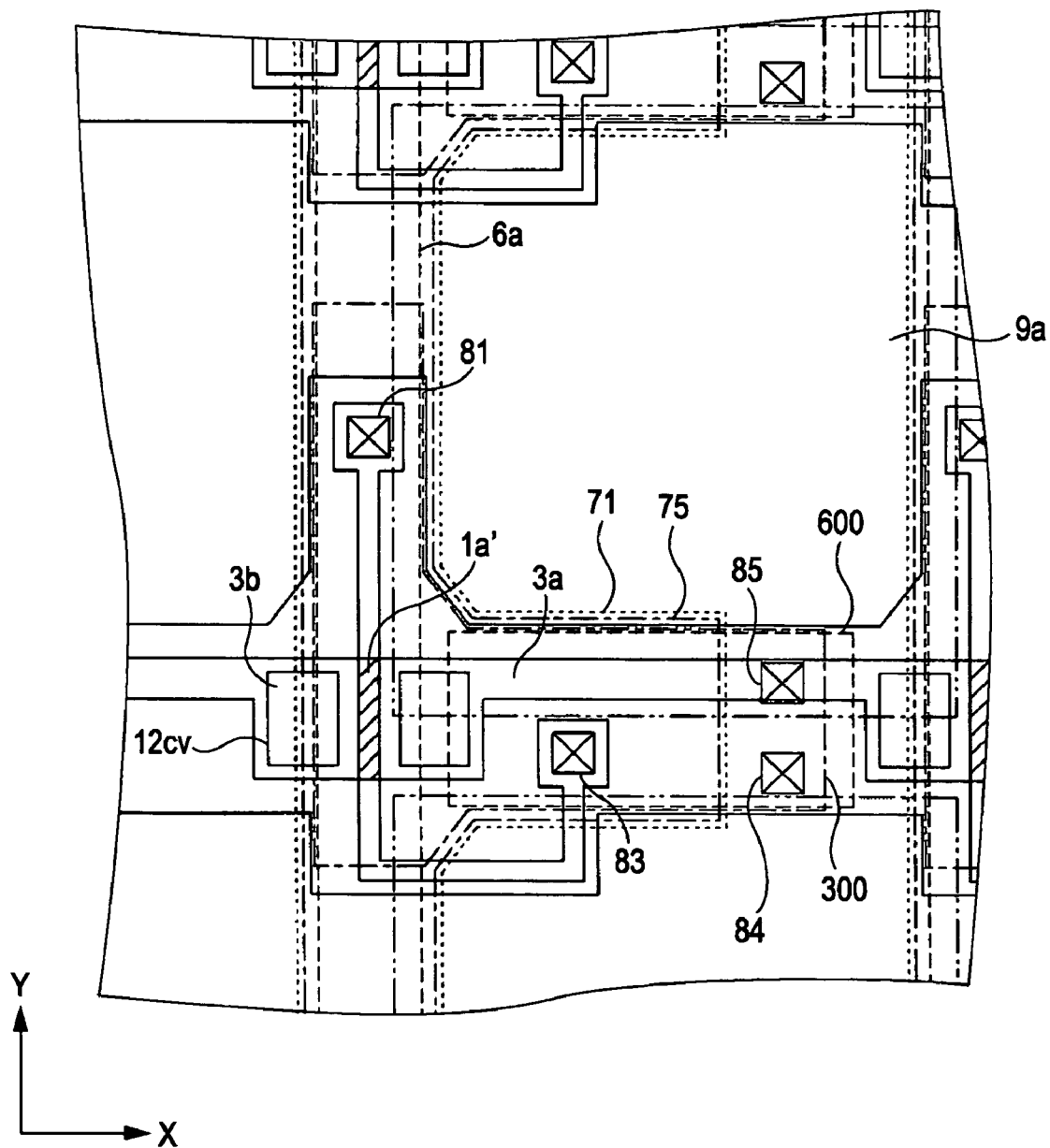
FIG. 6 is a plan view showing a portion on a magnified scale when
Figure 7:
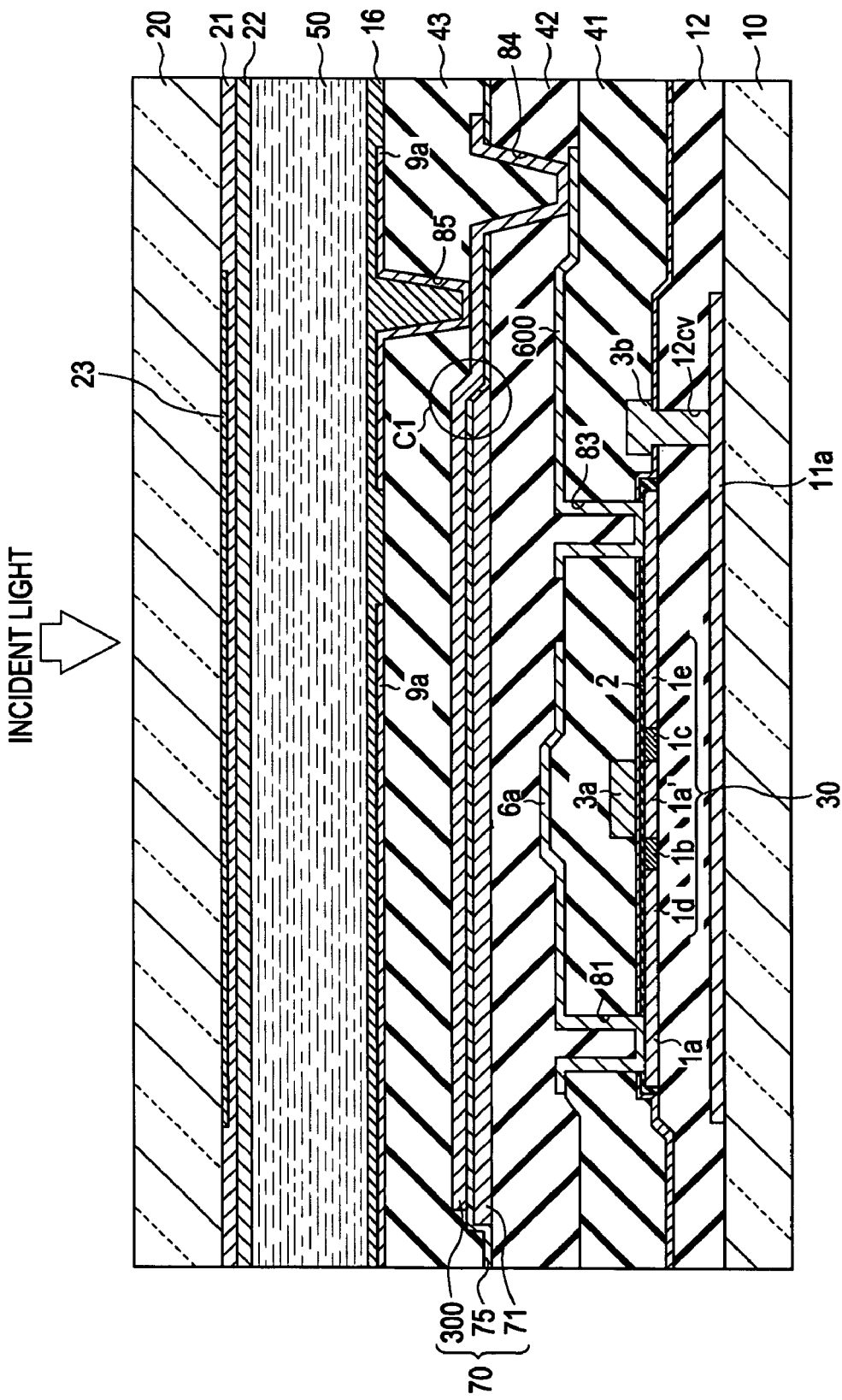
FIG. 7 is a cross-sectional view taken along the line VII-VII when
Figure 8:
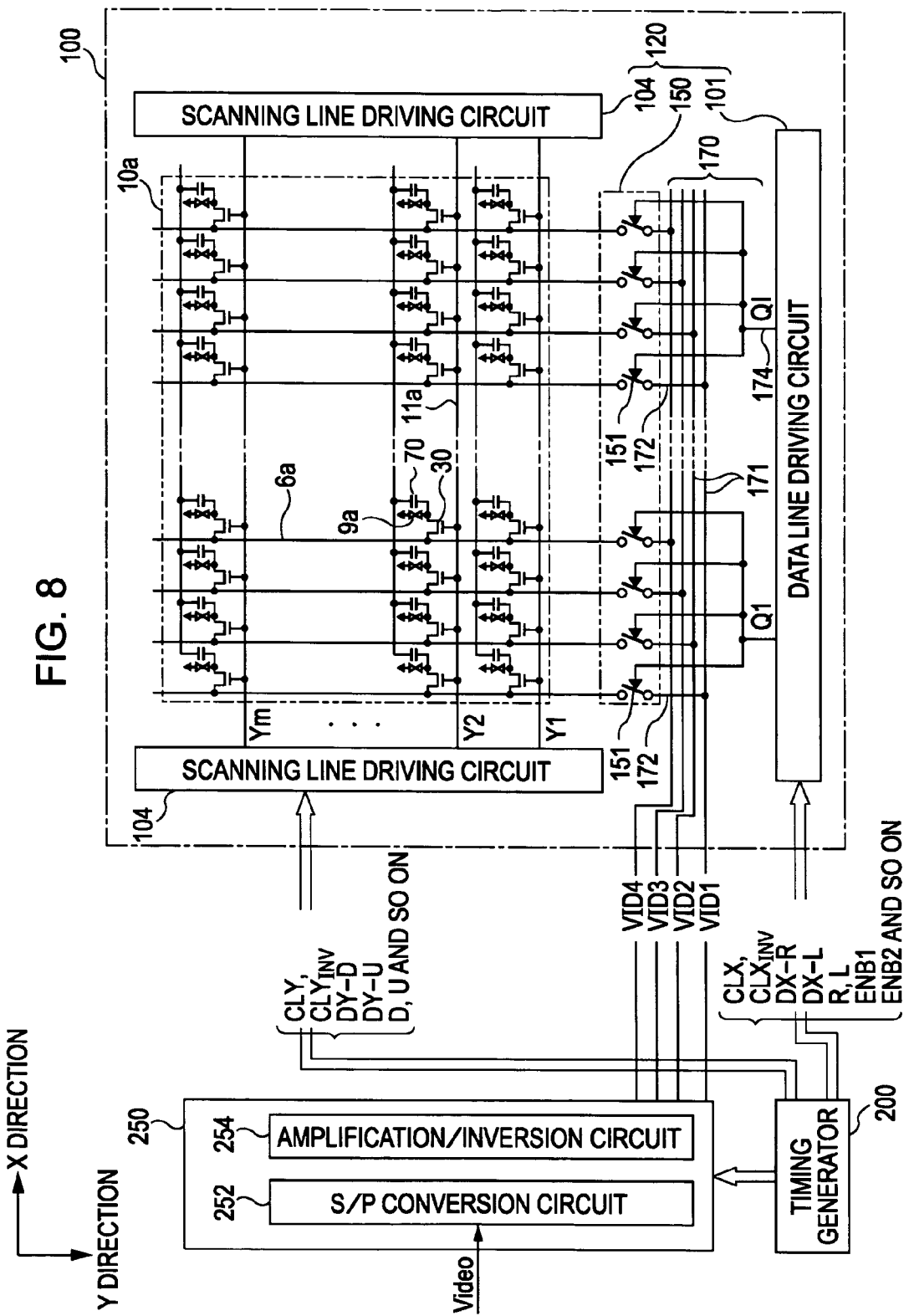
FIG. 8 is a block diagram showing the configuration of a liquid crystal device.
Figure 9:
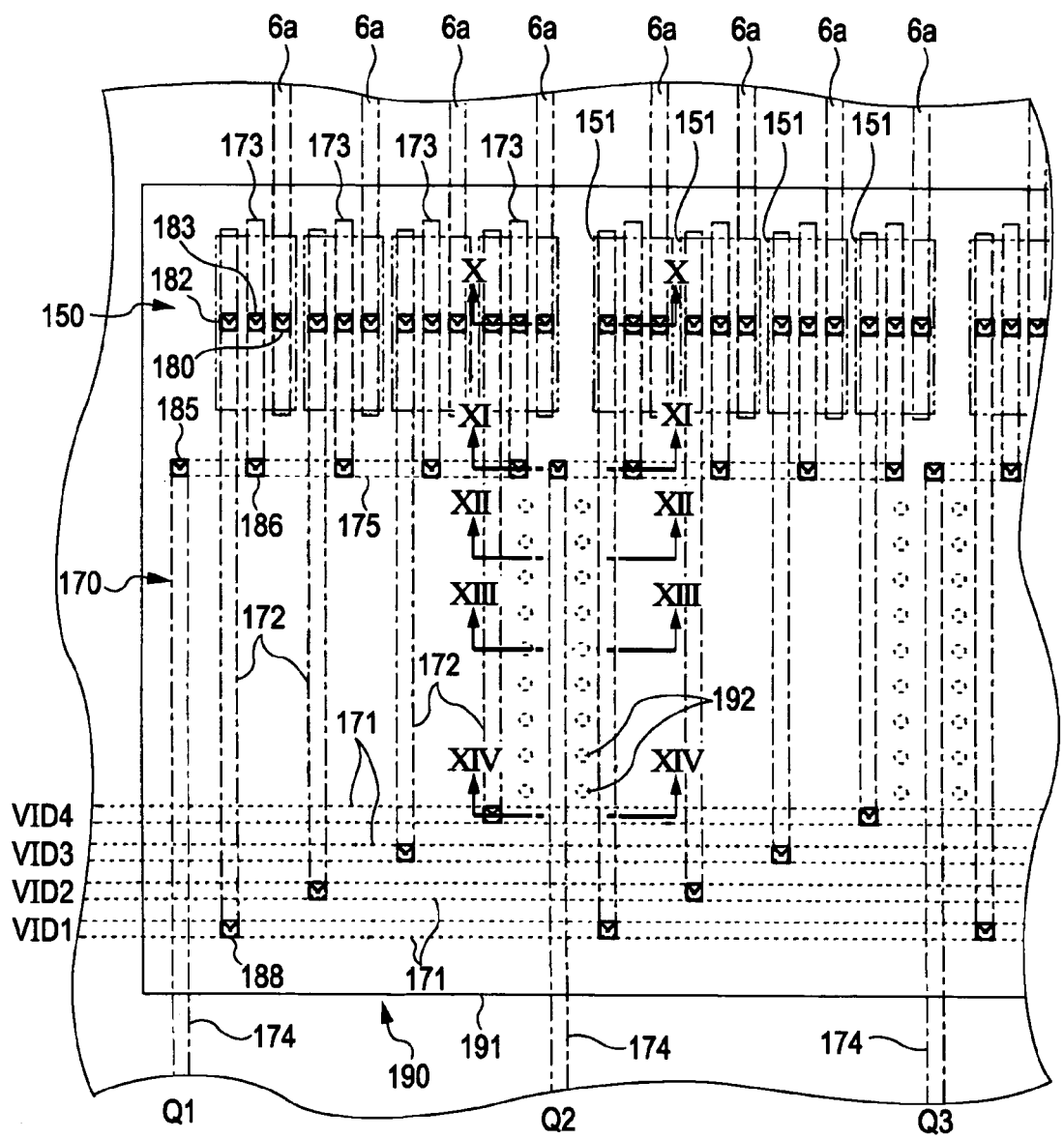
FIG. 9 is a plan view showing essential parts of a sampling circuit and a wiring line portion.
Figure 14:
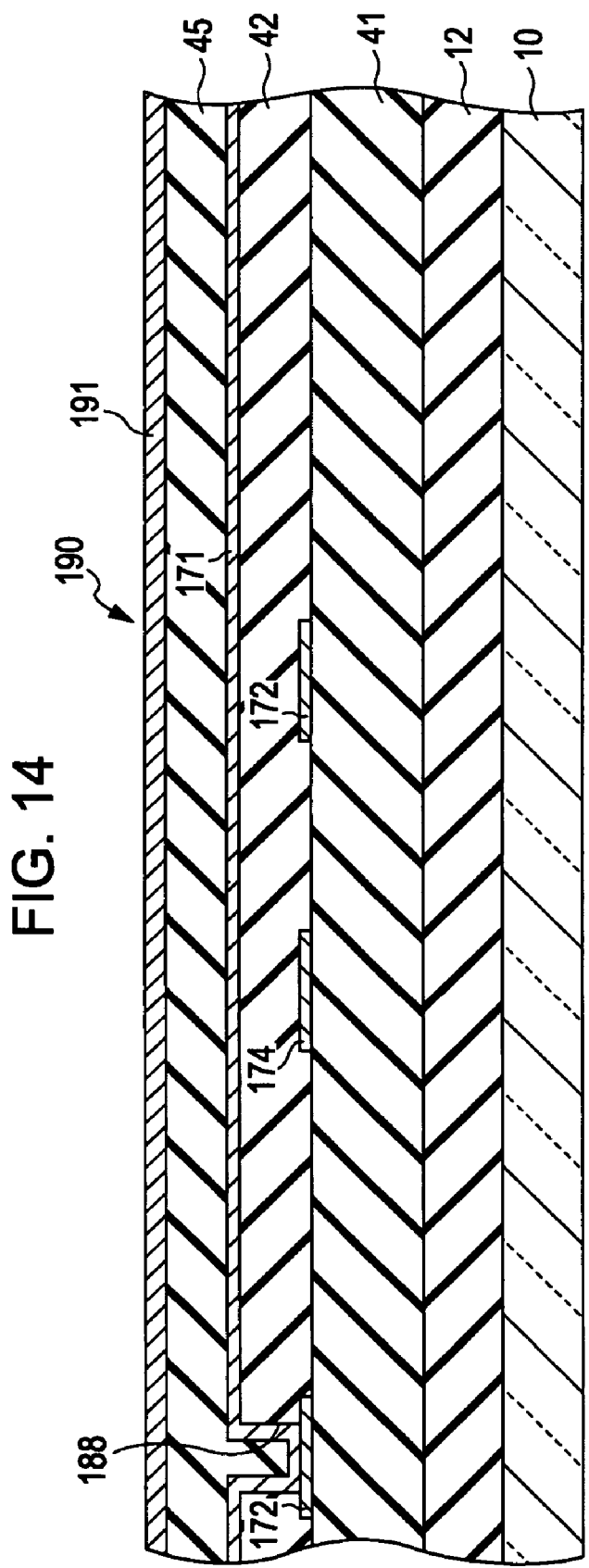
FIG. 14 is a cross-sectional view taken along the line XIV-XIV of FIG. 9.
Figure 15:
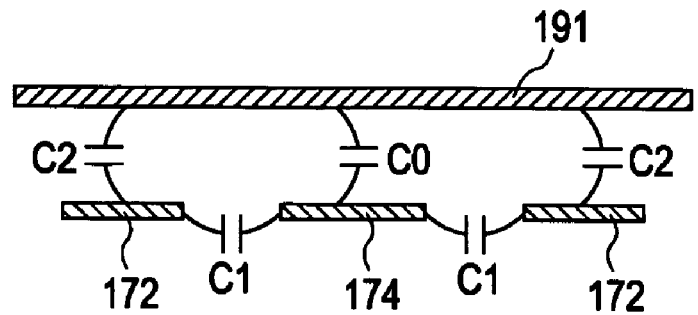
FIG. 15 is an explanatory view showing capacitively coupled signals lines.
Figure 16:
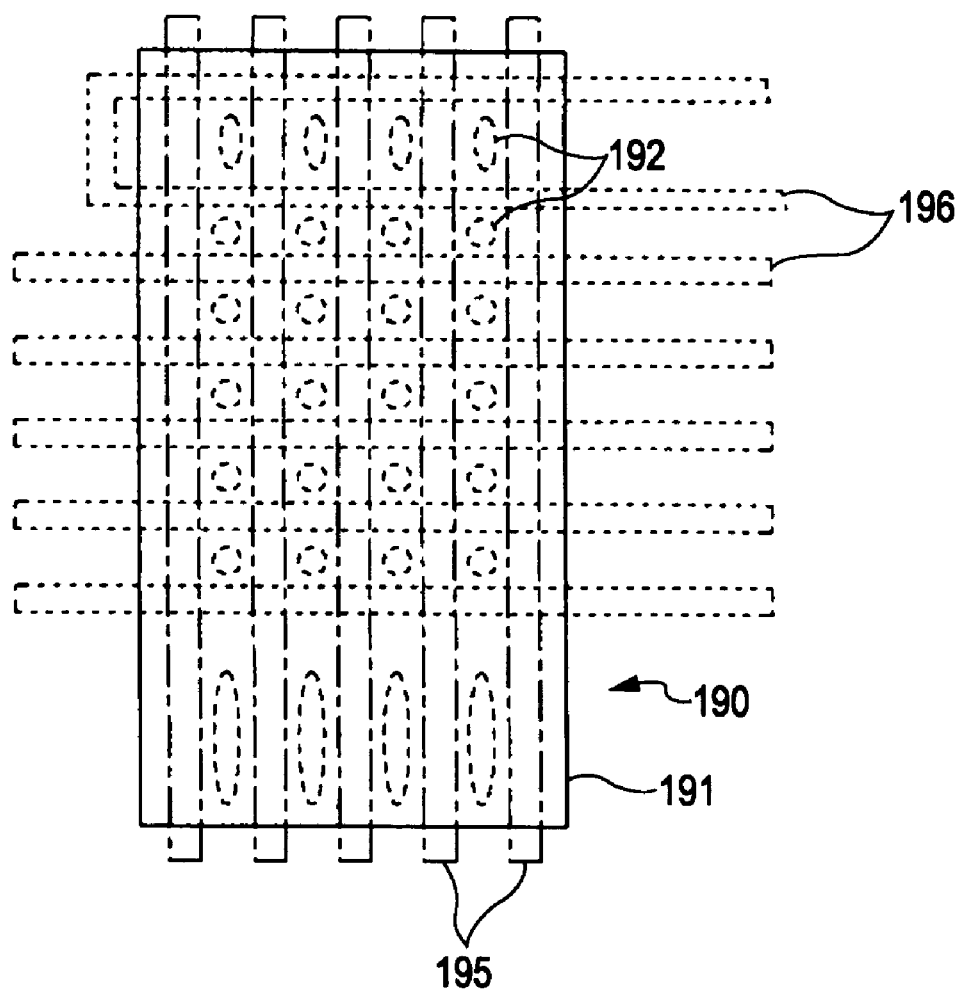
FIG. 16 is a plan view showing a modification of an electromagnetic shield.
Figure 17:
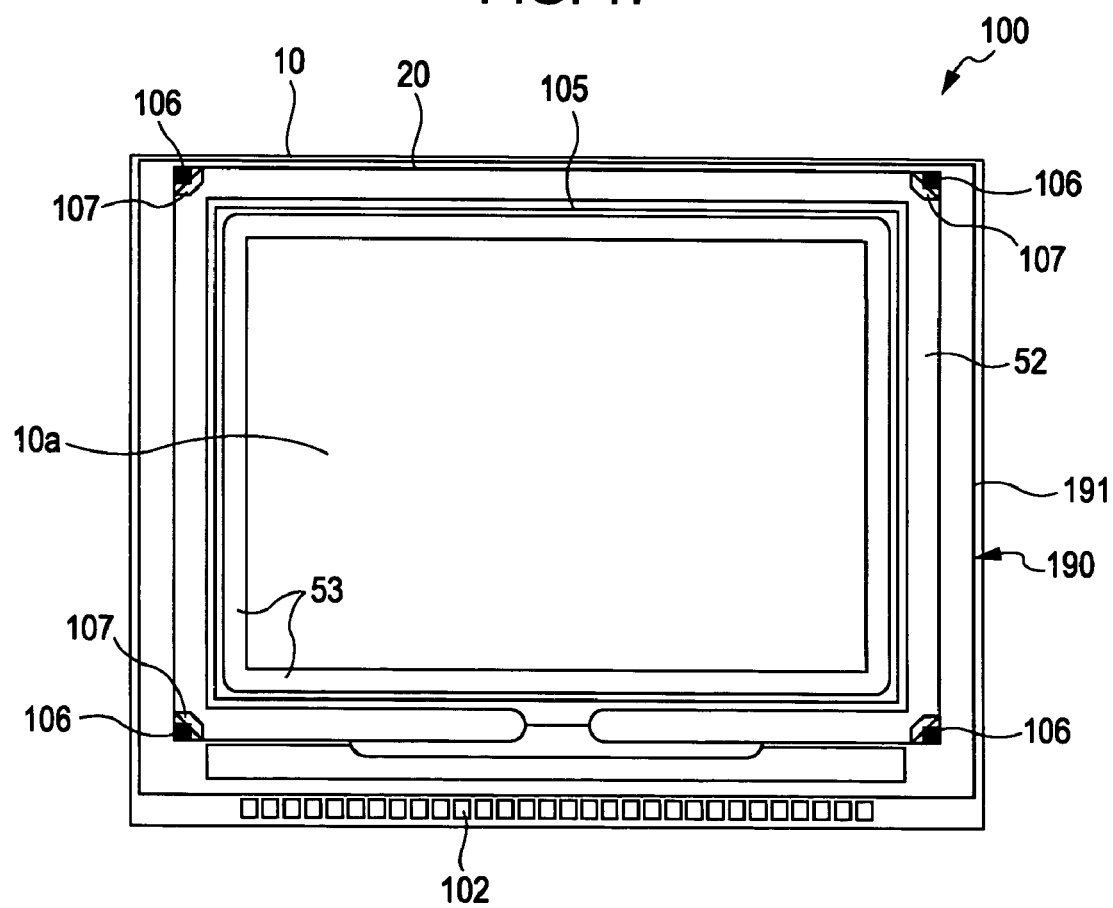
FIG. 17 is a plan view showing another modification of an electromagnetic shield.
Figure 18:
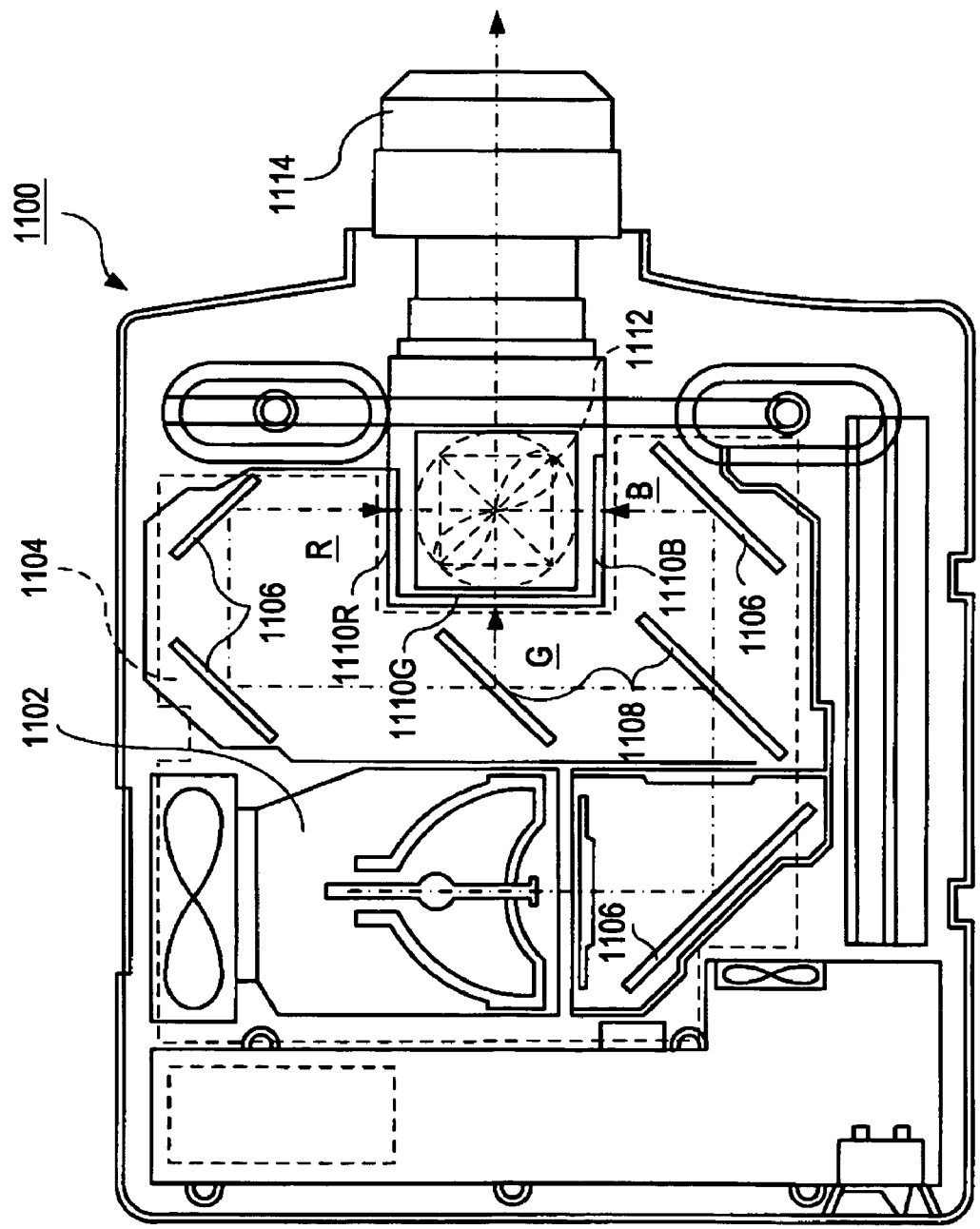
FIG. 18 is a plan view showing the configuration of a projector as an example of an electronic apparatus to which an electro-optical device is applied.

Hereinafter, an embodiment of the invention will be described with reference to the drawings. FIG. 1 is a plan view showing the configuration of a liquid crystal panel. FIG. 2 is a cross-sectional view taken along the line II-II of FIG. 1. FIG. 3 is an equivalent circuit diagram of various elements, wiring lines, and so on in a plurality of pixels which are formed in a matrix shape so as to form an image display region of a liquid crystal panel. FIGS. 4 to 6 are plan views showing the partial configuration of a pixel portion on a TFT array substrate. FIGS. 4 and 5 correspond to a lower layer portion (FIG. 4) and an upper layer portion (FIG. 5) of a laminated structure described below. FIG. 6 is a plan view showing a laminated structure on a magnified scale, in which FIGS. 4 and 5 are superimposed. FIG. 7 is a cross-sectional view taken along the line VII-VII when FIGS. 4 and 5 are superimposed. FIG. 8 is a block diagram showing the configuration of a liquid crystal device. FIG. 9 is a plan view showing essential parts of a sampling circuit and a wiring line portion. FIG. 10 is a cross-sectional view taken along the line X-X of FIG. 9. FIG. 11 is a cross-sectional view taken along the line XI-XI of FIG. 9. FIG. 12 is a cross-sectional view taken along the line XII-XII of FIG. 9. FIG. 13 is a cross-sectional view taken along the line XIII-XIII of FIG. 9. FIG. 14 is a cross-sectional view taken along the line XIV-XIV of FIG. 9. FIG. 15 is an explanatory view showing capacitively coupled signals lines. FIGS. 16 and 17 are plan views showing a modification of an electromagnetic shield. FIG. 18 is a plan view showing the configuration of a projector as an example of an electronic apparatus to which an electro-optical device is applied.

An embodiment of the invention will now be described with reference to the drawings. In the following embodiment, a TFT active matrix driving mode liquid crystal device having a driving circuit therein is illustrate as an example of an electro-optical device of the invention. As shown in FIG. 8, in this embodiment, a liquid crystal device includes a liquid crystal panel 100, a timing generator 200, and an image signal processing circuit 250.

Overall Configuration of Liquid Crystal Panel

First, the overall configuration of the liquid crystal panel 100 according to this embodiment will be described with reference to FIGS. 1 and 2. Referring to FIGS. 1 and 2, in the liquid crystal panel 100 according to this embodiment, a TFT array substrate 10 and a counter substrate 20 are disposed to face each other. A liquid crystal layer 50 is filled between the TFT array substrate 10 and the counter substrate 20. The TFT array substrate 10 and the counter substrate 20 are bonded to each other by a sealant 52, which is provided in a sealing region around an image display region 10a.

Referring to FIG. 1, a frame-shaped light-shielding film 53 is provided on the counter substrate 20 inside the sealing region in which the sealant 52 is disposed so as to define a frame region of the image display region 10a. A data line driving circuit 101 and external circuit connecting terminals 102 are provided along one side of the TFT array substrate 10 in a region outside the sealing region of a peripheral region in which the sealant 52 is disposed. A sampling circuit 150 is provided so as to be covered with the frame-shaped light-shielding film 53 inside the sealing region along one side. Further, scanning line driving circuits 104 are provided inside the sealing region along two sides adjacent to one side so as to be covered with the frame-shaped light-shielding film 53. In addition, vertical connecting terminals 106 are disposed on the TFT array substrate 10 in regions corresponding to four corners of the counter substrate 20 so as to connect both substrates by vertical connecting materials 107. Accordingly, the TFT array substrate 10 and the counter substrate 20 can be electrically connected to each other.

Relay wiring lines 105 are formed on the TFT array substrate 10 so as to electrically connect the external circuit connecting terminals 102 to the data line driving circuit 101, the scanning line driving circuit 104, the vertical connecting terminals 106, and so on.

Referring to FIG. 2, a laminated structure of pixel switching TFTs (Thin Film Transistors) serving as driving elements or wiring lines such as scanning lines, data lines, and so on is formed on the TFT array substrate 10. Pixel electrodes 9a are provided on the pixel switching TFTs or the wiring lines such as the scanning lines, the data lines, and so on in the image display region 10a. On the other hand, on a surface of the counter substrate 20 facing the TFT array substrate 10, a light-shielding film is formed. Further, a counter electrode 21 formed of a transparent material such as ITO or the like is formed on the light-shielding film to face a plurality of pixel electrodes 9a.

In addition to the data line driving circuit 101 and the scanning line driving circuits 104, a test circuit, which tests quality and defects of a liquid crystal device during manufacture or at the time of shipment, or test patterns may be formed on the TFT array substrate 10.

Configuration of Image Display Region

Next, the configuration of a pixel portion of the liquid crystal panel 100 according to this embodiment will be described with reference to FIGS. 3 to 7. In FIG. 7, the scale of each layer or member has been adjusted in order to have a recognizable size in the drawings.

Principal Configuration of Pixel Portion

Referring to FIG. 3, in each of a plurality of pixels formed in a matrix shape so as to constitute the image display region of the liquid crystal panel 100, the pixel electrode 9a and a TFT 30 serving as a first switching element for switching control of the pixel electrode 9a. A data line 6a, to which an image signal is supplied, is electrically connected to a source of the TFT 30. The image signals S1, S2, . . . , and Sn supplied to the data lines 6a are supplied to a plurality (for example, four) of adjacent data lines 6a by groups.

A scanning line 11a is electrically connected to a gate of the TFT 30. Scanning signals Y1, Y2, . . . , Ym are linear-sequentially supplied to the scanning lines 11a in a pulsed manner in that order at a predetermined timing. The pixel electrode 9a is electrically connected to a drain of the TFT 30 so as to close the TFT 30 serving as a switching element for a predetermined period. Then, the image signals S1, S2, . . . , and Sn supplied from the data lines 6a are written at a predetermined timing.

The image signals S1, S2, . . . , and Sn having predetermined levels written into liquid crystal, which is an example of an electro-optical material, through the pixel electrodes 9a are held between the pixel electrodes 9a and the counter electrode formed on the counter substrate for a predetermined period. The alignment or order of a collection of molecules of liquid crystal changes according to the applied voltage level, such that gray-scale display by light modulation can be performed. In case of a normally white mode, transmittance of incident light decreases according to the applied voltage of each pixel. Meanwhile, in case of a normally black mode, transmittance of incident light increases according to the applied voltage of each pixel. As a whole, light having contrast according to the image signal is emitted from the liquid crystal device.

In order to prevent leakage of the held image signals, a storage capacitor 70 is added in parallel with a liquid crystal capacitor which is formed between the pixel electrode 9a and the counter electrode. One electrode of the storage capacitor 70 is connected to the drain of the TFT 30 in parallel with the pixel electrode 9a, and the other electrode thereof is connected to a fixed-potential capacitor wiring line 400, such that the potential on the other electrode can be made constant.

Specific Configuration of Pixel Portion

Next, the specific configuration of the pixel portion for implementing the above-described operations will be described with reference to FIGS. 4 to 7.

In FIGS. 4 to 7, circuit elements of the pixel portion described above are constructed on the TFT array substrate 10 as patterned and laminated conductive films. The TFT array substrate 10 is formed of a glass substrate, a quartz substrate, an SOI substrate, a semiconductor substrate, or the like. The TFT array substrate 10 is disposed to face the counter substrate 20 which is formed of a glass substrate or a quartz substrate. Each of the circuit elements has a first layer including the scanning line 11a, a second layer including the TFT 30, a third layer including the data line 6a and so on, a fourth layer including the storage capacitor 70 and so on, and a fifth layer including the pixel electrode 9a and so on. Further, a base insulating film 12 is provided between the first and second layers, a first interlayer insulating film 41 is provided between the second and third layers, a second interlayer insulating film 42 is provided between the third and fourth layers, and a third interlayer insulating film 43 is provided between the fourth and fifth layers, such that the above-described elements can be prevented from being short-circuited. Among these, the first to third layers correspond to a lower layer portion, and the fourth and fifth layers correspond to an upper layer portion, as shown in FIG. 5.

Configuration of First Layer—Scanning Line and so on

The first layer has the scanning lines 11a. Each of the scanning lines 11a is patterned to have a main line portion that extends in an X direction of FIG. 4 and a protruding portion that extends in a Y direction of FIG. 4 in which the data lines 6a extend. The scanning lines 11a are formed of, for example, conductive polysilicon. Alternatively, the scanning lines 11a may be formed of a metal simplex containing at least one high-melting-point metal selected from a group of titanium (Ti), chromium (Cr), tungsten (W), tantalum (Ta), molybdenum (Mo), and so on, an alloy thereof, metal silicide, polysilicide, or a laminate thereof.

According to this embodiment, in particular, each of the scanning lines 11a is disposed below the TFT 30 to include a region facing a channel region 1a' and is formed of a conductive film. For this reason, when a double-plate projector is constructed using back reflection in the TFT array substrate 10 or the liquid crystal device as a light valve, the scanning lines 11a can shield the channel region 1a' from return light, that is, light being emitted from other liquid crystal devices and passing through a synthesizing optical system, such as a prism or the like, from the lower layer side.

Configuration of Second Layer—TFT and so on

The second layer has the TFTs 30. Each of the TFTs 30 has an LDD (Lightly Doped Drain) structure, for example, and includes a gate electrode 3a, a semiconductor layer 1a, and an insulating film that includes the gate insulating film 2 for electrically isolating the gate electrode 3a from the semiconductor layer 1a. The gate electrode 3a is formed of, for example, conductive polysilicon. The semiconductor layer 1a is formed of, for example, polysilicon, and has a channel region 1a', a lightly doped source region 1b, a lightly doped drain region 1c, a heavily doped source region 1d, and a heavily doped drain region 1e. The TFT 30 preferably has the LDD structure, but may have an offset structure in which impurities are not implanted in the lightly doped source region 1b and the lightly doped drain region 1c. Further, a self-alignment-type TFT may be used, in which impurities are implanted at a high concentration with the gate electrode 3a as a mask so as to form the heavily doped source region and the heavily doped drain region.

The gate electrode 3a of the TFT 30 is electrically connected to the scanning line 11a via a contact hole 12cv formed in the base insulating film 12 at a portion 3b thereof. The base insulating film 12 is formed of a silicon oxide film and electrically isolates the first layer from the second layer. Further, the base insulating film 12 is formed on the entire surface of the TFT array substrate 10 so as to prevent element characteristics of the TFT 30 from changing due to roughness or contamination caused by the abrasion of a substrate surface.

The TFT 30 according to this embodiment may be a top gate type or a bottom gate type.

Configuration of Third Layer—Data Line and so on

The third layer has the data lines 6a and a relay layer 600.

Each of the data lines 6a has a three-layered structure of an aluminum film, a titanium nitride film, and a silicon nitride film, and is formed so as to partially cover the channel region 1a' of the TFT 30. For this reason, the data line 6a can be disposed close to the channel region 1a', and thus the channel region 1a' of the TFT 30 can be shielded from incident light from the upper layer side. Further, each of the data lines 6a is electrically connected to the heavily doped source region 1d through a contact hole 81 that passes through the first interlayer insulating film 41.

In a modification of this embodiment, a conductive film having reflectance lower than that of a conductive film, such as an Al film forming the main body of each of the data lines 6a or the like, may be formed on a side of the data line 6a facing the channel region 1a'. According to the modification, return light is prevented from being reflected by a surface of the data line 6a facing the channel region 1a, that is, the lower-layer-side surface of the data line 6a, and thus the occurrence of multiple-reflected light or stray light can be prevented. Therefore, an influence of light on the channel region 1a' can be reduced. As regards each of the data lines 6a, a metal having reflectance lower than that of the Al film forming the main body of the data line 6a or a barrier metal may be formed on the surface of the data line 6a facing the channel region 1a', that is, the lower-layer-side surface of the data line 6a. Further, as a metal having reflectance lower than that of the Al film or the barrier metal, chromium (Cr), titanium (Ti), titanium nitride (TiN), tungsten (W), and so on may be used.

The relay layer 600 is formed of the same film as the data line 6a. The relay layer 600 and the data line 6a are formed to be separated from each other, as shown in FIG. 4. Further, the relay layer 600 is electrically connected to the heavily doped drain region 1e of the TFT 30 through a contact hole 83 that passes through the first interlayer insulating film 41.

The first interlayer insulating film 41 is formed of, for example, NSG (non-silicate glass). Alternatively, the first interlayer insulating film 41 may be formed of silicate glass, such as PSG (phosphorus silicate glass), BSG (boron silicate glass), BPSG (boron phosphorus silicate glass), a silicon nitride, a silicon oxide, or the like.

Configuration of Fourth Layer—Storage Capacitor and so on

The fourth layer has the storage capacitors 70. Each of the storage capacitors 70 is configured such that a capacitor electrode (pixel-potential-side electrode) 300 and a lower electrode (fixed-potential-side electrode) 71 are disposed to face each other with a dielectric film 75 interposed therebetween. An extending portion of the capacitor electrode 300 is electrically connected to the relay layer 600 through a contact hole 84 that passes through the second interlayer insulating film 42. In this invention, the storage capacitor 70 has the pixel-potential-side electrode and the fixed-potential-side electrode as the upper electrode and the lower electrode, respectively. Alternatively, the pixel-potential-side electrode and the fixed-potential-side electrode may serve as the lower electrode and the upper electrode, respectively, and the lower electrode may be electrically connected to the relay layer 600.

The capacitor electrode 300 or the lower electrode 71 is a single layer formed of a metal simplex containing a metal having high light-shielding property, such as Al, Ti, W, and the like, an alloy thereof, metal silicide, polysilicide, or a laminate. For this reason, the storage capacitor 70 can be disposed on the data line 6a through the second interlayer insulating film 42 to be close to the data line 6a, and thus the channel region 1a' of the TFT 30 can be reliably shielded from incident light from the upper layer side.

A taper is provided at an edge of the lower electrode 71 facing the capacitor electrode 300 through the dielectric film 75 (see a circle C1 in FIG. 7). For this reason, a gap between the lower electrode 71 and the capacitor electrode 300 in the periphery of the edge becomes wider, as compared with a case where the taper is not provided. Therefore, a possibility of a short-circuit due to a manufacturing failure or a possibility of defects due to a concentration of electric field can be reduced.

In view of reliability, at the time of patterning the upper electrode, an etching stopper film may be formed or a protective film may be formed at an edge of a capacitor formation region so as to prevent electrical pressure resistance of the capacitor from being degraded due to the exposure of the surface of the lower electrode or the arrangement of the end surfaces of the lower and upper electrodes.

As shown in FIG. 5, the dielectric film 75 is formed in a non-opening region located at a gap between opening regions of the pixels on the TFT array substrate 10 in plan view. That is, the dielectric film 75 is rarely formed in the opening region. Accordingly, even through the dielectric film 75 is formed of a non-transparent film, there is no case where transmittance is lowered in the opening region. Therefore, the dielectric film 75 is formed of a silicon nitride film having a high dielectric constant or the like, not considering transmittance. For this reason, the dielectric film 75 can also serve as a film for blocking water or moisture. As a result, water resistance or moisture resistance can be increased. As the dielectric film, in addition to the silicon nitride film, for example, a single-layered film of hafnium oxide (HfO2), alumina (Al2O3), tantalum oxide (Ta2O5), or a multi-layered film thereof can be used.

The second interlayer insulating film 42 is formed of, for example, NSG. In addition, as the second interlayer insulating film 42, silicate glass, such as PSG, BSG, BPSG, or the like, silicon nitride, or silicon oxide can be used. The surface of the second interlayer insulating film 42 is subjected to a planarization treatment, such as a chemical mechanical polishing (CMP) or polishing treatment, a spin coating treatment, a burying treatment of recesses. Accordingly, unevenness due to these elements on the lower layer side is removed, and the surface of the second interlayer insulating film 42 is planarized. For this reason, a possibility that disturbance on the alignment state of the liquid crystal layer 50 interposed between the TFT array substrate 10 and the counter substrate 20 can be reduced, and thus high-quality display can be performed. This planarization treatment may be formed on the surface of other interlayer insulating films.

Configuration of Fifth Layer—Pixel Electrode and so on

The third interlayer insulating film 43 is formed on the entire surface of the fourth layer, and the pixel electrode 9a is formed on the third interlayer insulating film 43 as the fifth layer. The third interlayer insulating film 43 is formed of, for example, NSG. In addition, as the third interlayer insulating film 43, silicate glass, such as PSG, BSG, BPSG, or the like, silicon nitride, or silicon oxide can be used. Like the second interlayer insulating film 42, the surface of the third interlayer insulating film 43 is subjected to the planarization treatment, such as the CMP treatment or the like.

The pixel electrodes 9a (the contours are indicated by a broken ling 9a' in FIG. 5) are individually disposed in pixel regions that are divided vertically and horizontally. The data lines 6a and the scanning lines 11a are formed to be arranged in a lattice shape at boundaries of the pixel regions (see FIGS. 4 and 5). Further, the pixel electrodes 9a are formed of, for example, transparent conductive films, such as ITO (Indium Tin Oxide) or the like.

Each of the pixel electrodes 9a is electrically connected to the extending portion of the capacitor electrode 300 through a contact hole 85 that passes through the third interlayer insulating film 43 (see FIG. 7). Accordingly, the potential of the capacitor electrode 300, which is a conductive film just below the pixel electrode 9a, has a pixel potential. Therefore, during the operation of the liquid crystal device, there is no case where an adverse effect exerts on a pixel potential due to parasitic capacitance between the pixel electrode 9a and the underlying conductive film.

As described above, the extending portion of the capacitor electrode 300 and the relay layer 600, and the relay layer 600 and the heavily doped drain region 1e of the TFT 30 are electrically connected to each other through the contact holes 84 and 83, respectively. That is, the pixel electrode 9a and the heavily doped drain region 1e of the TFT 30 are connected to each other through the relay layer 600 and the extending portion of the capacitor electrode 300. Therefore, it is possible to prevent the connection of the pixel electrode and the drain using one contact hole from being difficult due to a long interlayer distance between them. Besides, there is no case where the laminated structure and a manufacturing process become complex.

An alignment film 16 subjected to a predetermined alignment treatment such as a rubbing treatment is provided on the pixel electrodes 9a.

Until now, the configuration of the pixel portion on the TFT array substrate 10 has been described. In this embodiment, three metal layers of a first metal layer for forming the data line 6a and the relay layer 600, a second metal layer for forming the lower electrode 71, and a third metal layer forming the capacitor electrode 300 are provided.

Meanwhile, a counter electrode 21 is provided on the entire surface of the counter substrate 20 facing the TFT array substrate 10, and an alignment film 22 is provided on the counter electrode 21 (on the lower side of the counter electrode 21 in FIG. 7). Like the pixel electrodes 9a, the counter electrode 21 is formed of, for example, a transparent conductive film, such as ITO or the like. Moreover, in order to prevent the occurrence of optical leak current in the TFT 30, a light-shielding film is provided between the counter substrate 20 and the counter electrode 21 so as to cover at least a region facing the TFT 30.

The liquid crystal layer 50 is provided between the TFT array substrate 10 and the counter substrate 20 having the above-described configuration. The liquid crystal layer 50 is formed by filling liquid crystal into a space, which is defined by sealing the peripheral portions of the substrates 10 and 20 by the sealant. The liquid crystal layer 50 is configured to have an initial alignment state by the alignment films 16 and 22 subjected to the alignment treatment, such as the rubbing treatment or the like, in a state where an electric field is not applied between the pixel electrode 9a and the counter electrode 21.

The configuration of the pixel portion described above is common to the individual pixel portions, as shown in FIGS. 4 and 5. In the image display region 10a (see FIG. 1), the pixel portions are formed at regular intervals. Meanwhile, in the liquid crystal panel 100, a peripheral region located in the periphery of the image display region 10a, as described with reference to FIGS. 1 and 2, a driving circuit 120, which serves as a driving unit having the scanning line driving circuits 104, the data line driving circuit 101, the sampling circuit 150, and so on, is formed. The driving circuit 120 drives the individual pixels of the image display region 10a on the basis of various signal to be supplied from a timing generator 200, an image signal processing circuit 250, and so on.

Driving Control System of Image Display Region

As shown in FIG. 8, the timing generator 200 outputs timing signals or control signals that are used in the individual parts.

When one channel of an image signal Video is input, an S/P (Serial to Parallel) conversion circuit 252 in the image signal processing circuit 250 converts one channel of the image signal Video into, for example, four channels of image signals (serial-to-parallel conversion) and outputs the four channels of the image signals in order to perform writing by phase expansion. In this case, the serial-parallel conversion of the image signal into the four channels is performed to extend application time of the image signal to a source region of a TFT forming a switch 151 as a sampling switching element (second switching element) in the sampling circuit 150 so as to secure sufficient sampling time and charge/discharge time. That is, the serial-to-parallel conversion is performed to prevent a driving frequency related to the sampling circuit 150 from being drastically increased.

An amplification/inversion circuit 254 of the image signal processing circuit 250 inverts the polarities of the image signals, which need to be inverted, among the serial-to-parallel converted image signals and properly amplifies the inverted image signals to supply the amplified image signals to the liquid crystal panel 100 as the image signals in parallel. In general, whether or not the image signals are to be inverted is determined depending on whether data signals are applied with a polarity inversion for each scanning line 11a, a polarity inversion for each data line 6a, or a polarity inversion for each pixel. Further, an inversion cycle is set to one horizontal scanning period or dot clock cycle.

The polarity inversion means that a voltage level is alternately inverted between positive and negative polarities on the basis of an amplitude-centered potential of an image signal. For example, with the potential of the counter electrode 21 or a common potential as the reference potential, the voltage level is alternately inverted between the positive and negative sides of the reference potential. Alternatively, with a ground potential as the reference potential, the voltage level may be alternately inverted between the positive and negative sides of the reference potential. In addition, although the timing at which the four channels of the image signals VID1 to VID4 are supplied to the liquid crystal panel 100 are made simultaneous in the liquid crystal device shown in FIG. 8, the timing may be sequentially shifted in synchronization with the dot clock. In this case, the four channels of the image signals are sequentially sampled by the sampling circuit 150.

When four-phase expansion is used to drive the image display region 10a, the sampling circuit 150 samples the image signals simultaneously according to a corresponding one of sampling signals Q1, . . . , and Q1 and supplies the sampled image signals to the data lines 6a belonging to a group (block) including four data lines 6a. Specifically, the sampling circuit 150 has the switches 151 provided for the individual data lines 6a, and each of the switches 151 is interposed between one end of the corresponding data line 6a and a signal line to which one of the image signals is supplied. The sampling signals Q1, . . . , and Q1 are supplied to gates of the individual switches 151.

The four image signals VID1 to VID4 are supplied to the sampling circuit 150 from the image signal processing circuit 250 through four signal lines 171 formed in a wiring line portion 170 in parallel.

The data line driving circuit 101 sequentially shifts a transmission start pulse DX-R or DX-L to be supplied at the beginning of the horizontal scanning period according to a clock signal CLX and an inverted clock signal CLXinv so as to output the sampling signals Q1, . . . , and Q1 in a predetermined sequence. All of the clock signal CLX, the inverted clock signal CLXinv, the transmission start pulse DX-R (DX-L), and enable signals (pulse-width limiting signals) ENB1 and ENB2 to be supplied to the data line driving circuit 101 are supplied in synchronization with the image signals VID1 to VID4 by the timing generator 200.

In addition, when horizontal scanning is performed in a right direction, the transmission start pulse DX-R is supplied at the beginning of the horizontal scanning period, and a transmission control signal R becomes active. Meanwhile, when horizontal scanning is performed in a left direction, the transmission start pulse DX-L is supplied at the beginning of the horizontal scanning period, and a transmission control signal L becomes active. As such, in this embodiment, the data line driving circuit 101 is of a bidirectional type. However, the data line driving circuit 101 may be of a unidirectional type according to either the transmission start pulse DX-R or the transmission start pulse DX-L.

The scanning line driving circuit 104 basically has the same configuration as the data line driving circuit 101 except for a difference in the direction of an output signal, an input signal, and a driving frequency. Specifically, the scanning line driving circuit 104 is arranged at a position from the data line driving circuit 101 by 90 degrees. The scanning line driving circuit 104 receives a pulse DY-D (DY-U) and a transmission control signal D (U), instead of the pulse DX-R (DX-L) and the transmission control signal R(L). In addition, the scanning line driving circuit 104 receives a clock signal CLY and an inverted clock signal CLYinv for each horizontal scanning period, instead of the clock signal CLX and the inverted clock signal CLXinv. Accordingly, the scanning line driving circuit 104 linear-sequentially outputs the scanning signals Y1, . . . , and Ym.

When vertical scanning is performed in a downward direction, the pulse is supplied at the beginning of the vertical scanning period, and the transmission control signal D becomes active. Meanwhile, when vertical scanning is performed in the upward direction, the pulse DY-U is supplied at the beginning of the vertical scanning period, and the transmission control signal U becomes active. As such, in this embodiment, the scanning line driving circuit 104 is of a bidirectional type. However, the scanning line driving circuit 104 may be of a unidirectional type according to either the transmission start pulse DY-D or the transmission start pulse DY-U.

The detailed configuration of the sampling circuit 150 and the wiring line portion 170 will be described with reference to FIGS. 9 to 14.

As shown in FIG. 10, in this embodiment, each of the switches 151 of the sampling circuit 150 is a TFT having an LDD structure, which is formed by the substantially same manufacturing process as the TFT 30 of the image display region 10a, for example. That is, like the TFT 30, the switch 151 includes a gate electrode 153a, a semiconductor layer 1a, and an insulating film 2 including a gate insulating film for electrically isolating the gate electrode 153a from the semiconductor layer 1a. The first interlayer insulating film 41 is laminated on the switch 151. The data line 6a, which extends from the image display region 10a, is electrically connected to a heavily doped drain region 1e of the switch 151 through a contact hole 180, which passes through the first interlayer insulating film 41.

As shown in FIG. 9, in the wiring line portion 170, a signal line 172 corresponding to a heavily doped source region 1d of each of the switches 151, and a signal line 173 to be connected to the gate electrode of the switch 151 is formed of the same metal layer as the data line 6a (first metal layer). Further, a signal line 174 is formed so as to be connected to the data line driving circuit 101 for each group.

As shown in FIG. 10, the signal line 172 is electrically connected to the heavily doped source region 1d of the switch 151 through a contact hole 182, which passes through the first interlayer insulating film 41. Further, the signal line 173 is electrically connected to the gate electrode 153a of the switch 151 through a contact hole 183, which passes through the first interlayer insulating film 41. In addition, as shown in FIGS. 10 to 14, the second interlayer insulating film 42 is laminated on the data lines 6a and the signal lines 172 to 174.

As shown in FIG. 9, in the wiring line portion 170, a signal line 175, which relays the signal line 173 and the signal line 174 for each group, is formed of the same metal layer as the metal layer forming the lower electrode 71 of the storage capacitor 70 in the image display region 10a (second metal layer). Further, four signal lines 171, which are connected to the image signal processing circuit 250, are formed.

As shown in FIG. 11, the signal line 175 is electrically connected to the signal line 174 through a contact hole 185, which passes through the second interlayer insulating film 42, and also is electrically connected to the signal line 173 through a contact hole 186, which passes through the second interlayer insulating film 42. Accordingly, the sampling signals Q1, . . . , and Q1 are individually supplied to the gates of the switches 151 for each group.

As shown in FIG. 14, the signal line 171 is electrically connected to the corresponding signal line 172 through a contact hole 188, which passes through the second interlayer insulating film 42. Accordingly, the corresponding video signals VID1 to VID4 are supplied to the four switches 151 of each group in parallel.

As shown in FIGS. 10 to 14, an interlayer insulating film 45 is laminated on the signal lines 171 and 175. Further, in the image display region 10a, the dielectric film 75 of the storage capacitor 70 is formed in a region where the interlayer insulating film 45 is removed by etching or the like. Therefore, the interlayer insulating film 45 is not shown in FIG. 7.

On the interlayer insulating film 45, an electromagnetic shield 190 is formed of the same metal layer as the metal layer forming the capacitor electrode 300 of the storage capacitor 70 (third metal layer) in the image display region 10a. The electromagnetic shield 190 has a first shield portion 191 that integrally covers the upper layer portion of the wiring line portion 170, and a second shield portion 192 that is buried and disposed at essential places of the driving circuit 120 (in this embodiment, on both sides of the signal line 174 located between the groups that sequentially perform phase expansion).

As shown in FIG. 9, in this embodiment, the electromagnetic shield 190 extends to the driving circuit 120 (specifically, the sampling circuit 150). Further, as shown in FIG. 13, in this embodiment, the second shield portion 192 is a cylindrical shield portion which is formed by forming a hole in the interlayer insulating films 45, 42, and 41 and burying the hole with the third metal layer. In addition, the second shield portion 192 may be a plate shield portion which is formed by forming a groove in the interlayer insulating films 45, 42, and 41 and burying the groove with the third metal layer, instead of the cylindrical shield portion.

Though not shown, in this embodiment, the electromagnetic shield 190 is electrically connected to the lower electrode 71 serving as the fixed-potential-side electrode of the storage capacitor 70 in the image display region 10a through a contact hole and so on.

As described above, in this embodiment, the signal lines 171 to 175 of the wiring line portion 170 are formed of the first metal layer forming the data line 6a and the relay layer 600 and the second metal layer forming the lower electrode 71 of the storage capacitor 70 in the image display region 10a. Further, the electromagnetic shield 190 is formed of the third metal layer forming the capacitor electrode 300 in the image display region 10a. That is, the individual elements of the driving circuit 120, the signal lines, and so on to be formed on the liquid crystal panel 100, and the electromagnetic shield 190 are formed by the same manufacturing process as the TFT 30 and the storage capacitor 70 in the image display region 10a.

According to this configuration, since the upper layer portion of the wiring line portion 170 is covered with the first shield portion 191 and the signal lines 171 to 175 and so on are capacitively coupled to the first shield portion 191, a capacitively coupled component between adjacent signal lines can be dispersed. Therefore, an influence by a change in potential between adjacent signal lines can be reduced. For example, as shown in FIG. 15, since a capacitively coupled component C1 between adjacent signal lines 172 and 174 is dispersed by capacitive coupling of the signal line 172 and the first shield portion 191 (C2) and capacitive coupling of the signal line 174 and the first shield portion 191 (C0) between the groups of adjacent phase expansions, the influence by the change in potential between the signal lines 172 and 174 is reduced. In addition, since the second shield portion 192 is buried and disposed at the important place between the signal lines, a high shield effect can be achieved. Therefore, an influence by noise on the image signals can be suppressed, and thus high-quality image display can be performed.

In this case, the image display region 10a is formed using at least three metal layers, and the signal lines 171 to 175 are formed using at least two metal layers of the three metal layers. Accordingly, wiring of the individual signal lines which cross one another within the wiring line portion 170 can be easily achieved. Further, since the electromagnetic shield 190 is formed using the third metal layer other than the first and second metal layers forming the individual signal lines 171 to 175, the electromagnetic shield can be formed at an arbitrary place of the wiring line portion 170.

Further, since the electromagnetic shield 190 formed in the wiring line portion 170 extends to the driving circuit 120, such as the sampling circuit 150 or the like, the influence by noise on the image signals can be suppressed at a higher level, and thus high-quality image display can be achieved.

Further, since the electromagnetic shield 190 is electrically connected to the lower electrode 71 serving as the fixed-potential-side electrode of the storage capacitor 70, the electromagnetic shield 190 can be maintained to a constant potential. Therefore, an influence by a change in potential of the individual signal lines 171 to 175 can be effectively reduced by the first shield portion 191.

For example, as shown in FIG. 16, the electromagnetic shield 190 may be formed in a region where a shield property of the wiring line portion 170 needs to be high. In this case, the electromagnetic shield 190 is also suitably formed by the metal layer laminated on at least two metal layers forming the signal lines 195 and 196.

In contrast, as shown in FIG. 17, the first shield portion 191 may be formed in the entire peripheral region of the image display region 10a. In this case, the first shield portion 191 can also serve as a light-shielding film.

Electronic Apparatus

Next, a case where a liquid crystal device as the above-described electro-optical device is applied to an electronic apparatus will be described. As an example, a projector (a projection-type display device) which uses the liquid crystal device as a light valve) will be described.

As shown in FIG. 18, a projector 1100 includes a lamp unit 1102 having a white light source, such as a halogen lamp. Projection light emitted from the lamp unit 1102 is separated into light components of three primary colors of R (red), G (green), and B (blue) by four mirrors 1106 and two dichroic mirrors 1108 disposed in a light guide 1104, and the light components of three primary colors are incident on liquid crystal panels 1110R, 1110B, and 1110G, serving as light valves, corresponding to the respective colors of R, G, and B.

The configurations of the liquid crystal panels 1110R, 1110B, and 1110G are the same as that of the above-described liquid crystal device, and the liquid crystal panels 1110R, 1110B, and 1110G are individually driven by signals of the three primary colors of R, G, and B to be supplied from an image signal processing circuit. The light components modulated by the liquid crystal panels are incident on a dichroic prism 1112 from three directions. In the dichroic prism 1112, the R and B light components are refracted by 90 degrees, and the G light component goes straight. Therefore, the images of the respective colors are synthesized, and then a color image is projected onto a screen or the like through a projection lens 1114.

Here, paying attention to display images by the individual liquid crystal panels 1110R, 1110B, and 1110G, the display image by the liquid crystal panel 1110G needs to be horizontally inverted with respect to the display images by the liquid crystal panels 1110R and 1110B.

Moreover, the light components corresponding to the respective primary colors of R, G, and B are correspondingly incident on the liquid crystal panels 1110R, 1110B, and 1110G by the dichroic mirrors 1108, and thus color filters do not need to be provided.

In addition to the projector described with reference to FIG. 18, various electronic apparatuses, such as a mobile personal computer, a cellular phone, a liquid crystal television, a viewfinder-type or monitor-direct-view-type video tape recorder, a car navigation device, a pager, an electronic organizer, an electronic calculator, a word processor, a workstation, a video phone, a POS terminal, an apparatus having a touch panel, and the like can be exemplified. Of course, the invention can be applied to these electronic apparatuses.

The invention can be applied to a reflection-type liquid crystal device (LCOS), in which elements are formed on a silicon substrate, a plasma display panel (PDP), a field emission display (FED or SED), an organic EL display, or the like.

It should be understood that the invention is not limited to the above-described embodiments and examples, but various modifications can be made within the scope without departing from the subject matter or spirit of the invention defined by the appended claims and the entire specification. Therefore, an electro-optical device that accompanies such modifications, an electronic apparatus having an electro-optical device, and a method of manufacturing an electro-optical device still fall within the technical scope of the invention.

What is claimed is:

1. An electro-optical device comprising:
   first switching elements which are correspondingly provided at intersections of a plurality of scanning lines and a plurality of data lines in a display region; at least three metal layers which are provided in the display region;
   a wiring line portion which is provided in an adjacent region of the display region and supplies signals to second switching elements through signal lines formed of at least two metal layers of the three metal layers; and
   an electromagnetic shield which is provided in the adjacent region of the display region,
   wherein the electromagnetic shield has:
   a first shield portion which covers the wiring line portion using metal layers other than the metal layers forming the signal lines, and
   a second shield portion which is electrically connected to the first shield portion and is disposed between the signal lines.

2. An electro-optical device comprising:
   first switching elements which are correspondingly provided at intersections of a plurality of scanning lines and a plurality of data lines in a display region;
   three metal layers which correspond to capacitor electrodes on both sides of each of storage capacitors to be formed in the display region and each of the plurality of data lines;
   a wiring line portion which is provided in an adjacent region of the display region and supplies signals to second switching elements through signal lines formed of at least two metal layers of the three metal layers; and
   an electromagnetic shield which is provided in the adjacent region of the display region,
   wherein the electromagnetic shield has:
   a first shield portion which covers the wiring line portion using metal layers other than the metal layers forming the signal lines, and
   a second shield portion which is electrically connected to the first shield portion and is disposed between the signal lines.

3. The electro-optical device according to claim 1, wherein the electromagnetic shield is formed to extend to a peripheral region of a display unit which covers a driving circuit of the second switching elements.

4. The electro-optical device according to claim 1, wherein the driving circuit drives the second switching elements in a display unit by phase expansion for every predetermined block, and
   the second shield portion is at least disposed between adjacent blocks.

5. The electro-optical device according to claim 1, wherein storage capacitors are provided in the display region, and
   the electromagnetic shield is formed of the same metal layer as one electrode forming each of the storage capacitors.

6. The electro-optical device according to claim 5, wherein the electromagnetic shield is electrically connected to a fixed-potential-side electrode of each of the storage capacitors.

7. An electronic apparatus comprising the electro-optical device according to claim 1 as a display unit.

* * * * *